United States Patent
Yang et al.

(10) Patent No.: US 10,211,827 B2
(45) Date of Patent: Feb. 19, 2019

(54) RESONANT GATE DRIVER

(71) Applicant: Ford Global Technologies, LLC, Dearborn, MI (US)

(72) Inventors: Shuitao Yang, Dearborn Heights, MI (US); Fan Xu, Novi, MI (US); Yan Zhou, Carton, MI (US); Lihua Chen, Farmington Hills, MI (US); Mohammed Khorshed Alam, Dearborn, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 177 days.

(21) Appl. No.: 15/420,827

(22) Filed: Jan. 31, 2017

(65) Prior Publication Data
US 2018/0219546 A1    Aug. 2, 2018

(51) Int. Cl.
| | |
|---|---|
| *H02M 1/088* | (2006.01) |
| *H02M 3/155* | (2006.01) |
| *H02M 7/483* | (2007.01) |
| *H02M 7/5387* | (2007.01) |
| *H02M 7/5395* | (2006.01) |
| *H02P 27/08* | (2006.01) |
| *B60L 11/18* | (2006.01) |
| *B60L 15/02* | (2006.01) |
| *H03K 17/16* | (2006.01) |
| *H02M 1/08* | (2006.01) |
| *H02M 1/00* | (2006.01) |

(52) U.S. Cl.
CPC ........ *H03K 17/166* (2013.01); *B60L 11/1803* (2013.01); *B60L 15/02* (2013.01); *H02M 1/08* (2013.01); *H02M 1/088* (2013.01); *H02M 3/155* (2013.01); *H02M 7/5387* (2013.01); *H02M 7/5395* (2013.01); *H02P 27/08* (2013.01); *H03K 17/168* (2013.01); *B60L 2210/14* (2013.01); *H02M 7/483* (2013.01); *H02M 2001/007* (2013.01); *H02M 2001/0058* (2013.01)

(58) Field of Classification Search
CPC ................ H03K 17/166; H03K 17/168; B60L 11/1803; B60L 15/02; B60L 2210/14; H02M 1/08; H02M 1/088; H02M 3/155; H02M 7/483; H02M 7/5387; H02M 7/5395; H02M 2001/0058; H02M 2001/007; H02P 27/08
USPC .................................................. 307/9.1, 10.1
See application file for complete search history.

(56) References Cited

U.S. PATENT DOCUMENTS

| | | |
|---|---|---|
| 8,717,085 B2 | 5/2014 | Cioci |
| 8,847,631 B2 | 9/2014 | Tao et al. |
| 2015/0138858 A1 | 5/2015 | Kusama et al. |
| 2015/0188531 A1 | 7/2015 | Tang et al. |

*Primary Examiner* — Hal Kaplan
(74) *Attorney, Agent, or Firm* — David Kelley; Brooks Kushman P.C.

(57) ABSTRACT

A gate driver of a power device includes a power supply and a resonant circuit. The power supply may have a positive potential and a negative potential. The resonant circuit may include an inductor and be configured to recirculate charge during turn-off by inducing a first field based on a positive charge from a gate caused by the positive potential, and in response to reversal of a voltage across the inductor, collapsing the first field to draw charge from the gate.

20 Claims, 6 Drawing Sheets

RESONANT GATE DRIVER

TECHNICAL FIELD

This application is generally related to a gate driver for a solid state switch in which a resonant circuit recirculates energy between an inductor and gate to reduce gate switching losses.

BACKGROUND

Electrified vehicles including hybrid-electric vehicles (HEVs), plugin hybrid electric vehicles (PHEVs), and battery electric vehicles (BEVs) rely on a traction battery to provide power to a traction motor for propulsion and a power inverter therebetween to convert direct current (DC) power to alternating current (AC) power. The typical AC traction motor is a 3-phase motor that may be powered by 3 sinusoidal signals each driven with 120 degrees phase separation. The traction battery is configured to operate in a particular voltage range and provide a maximum current. The traction battery is alternatively referred to as a high-voltage battery wherein a terminal voltage of a typical traction battery is over 100 Volts DC. However, improved performance of electric machines may be achieved by operating in a different voltage range, typically at voltages greater than the traction battery terminal voltage. Likewise, the current requirements to drive a vehicular electric machine are commonly referred to as high current. Due to the high voltages and high currents typically driving an inductive load, a counter-electromotive force (cemf or back emf) or transient voltage spike may be experienced when a switch disconnects an inductive load from a current source and the field in the coil begins to collapse to maintain the voltage across the inductor.

Also, many electrified vehicles include a DC-DC converter, also referred to as a variable voltage converter (VVC), to convert the voltage of the traction battery to an operational voltage level of the electric machine. The electric machine, which may include a traction motor, may require a high voltage and high current. Due to the voltage, current and switching requirements, a solid state switch such as an Insulated Gate Bipolar junction Transistor (IGBT) is typically used to generate the signals in the power inverter and the VVC.

SUMMARY

A gate driver of a power device includes a positive supply, a negative supply, an inductor, and a high-side switch. The negative supply may be configured to apply a negative potential to a gate. The positive supply may be configured to apply a positive potential to the gate. The inductor may be configured to, during turn-on, induce a field based on the negative potential, and convert the field to a current to inject a positive charge onto the gate. The high-side switch may be configured to latch, to the positive potential, the positive charge.

A method, by a gate driver, of recirculating charge during transitioning of a power switch having an insulated gate for a vehicle powertrain during turn-on may include inducing a field in an inductor via a negative charge on a gate of the power switch, converting the field to a positive charge, flowing the positive charge onto the gate to turn on the power switch, and latching the positive charge onto the gate.

A gate driver of a power device includes a power supply and a resonant circuit. The power supply may have a positive potential and a negative potential. The resonant circuit may include an inductor and be configured to recirculate charge during turn-off by inducing a first field based on a positive charge from a gate caused by the positive potential, and in response to reversal of a voltage across the inductor, collapsing the first field to draw charge from the gate.

DETAILED DESCRIPTION

Figure 1:
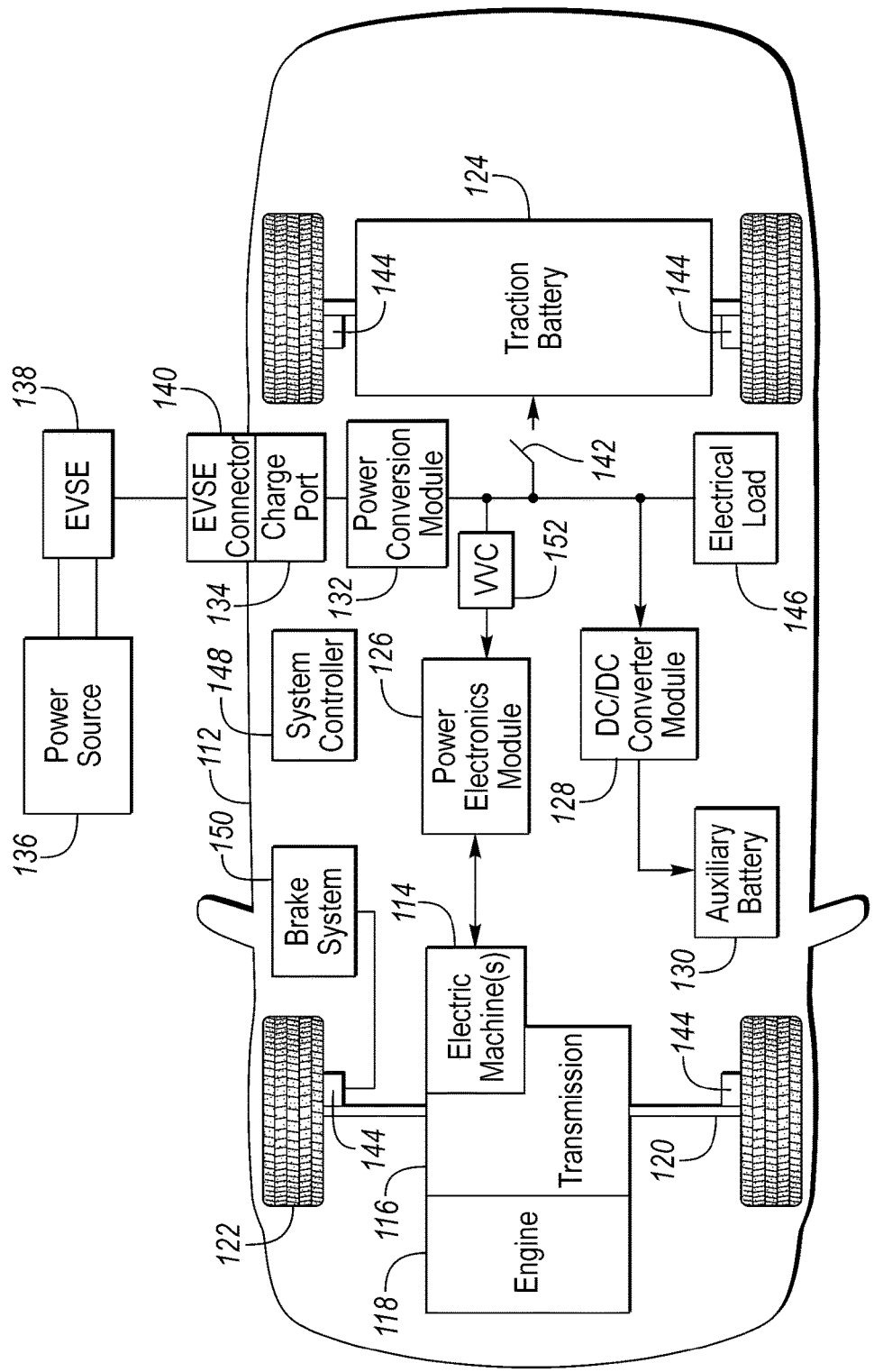
FIG. 1 is a diagram of a hybrid vehicle illustrating typical drivetrain and energy storage components with a variable voltage converter and power inverter therebetween.

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Generally, solid state devices (SSD), such as Insulated Gate Bipolar junction Transistors (IGBTs), Metal Oxide Semiconductor Field Effect Transistors (MOSFETs), or Bipolar Junction Transistors (BJTs) are widely used in a variety of automotive and industrial applications, such as electric motor drives, power inverters, DC-DC converters, and power modules. Operation of an IGBT and a MOSFET is voltage controlled, in which the operation is based on a voltage applied to a gate of the IGBT or MOSFET, while operation of a BJT is current controlled, in which the operation is based on a current applied to a base of the BJT. Here, the use of an IGBT will be discussed, however the structure and methods may be applicable to other SSDs, for example, an insulated gate SSD includes both an IGBT and a MOSFET. Operation of an IGBT is controlled by a gate voltage supplied by a gate driver. Conventional gate drivers are typically based on a voltage, greater than a threshold voltage, applied to the IGBT gate with a current limiting resistor, which typically consists of a switchable voltage source and a gate resistor. A low gate resistance would lead to a fast switching speed and low switching loss, but may also cause higher stresses on the semiconductor devices, e.g. over-voltage stresses. Therefore, the gate resistance is selected to seek a compromise between switching loss, switching delay, and stresses. When turning off an IGBT, the gate resistor reduces the current flowing from the gate and thereby increases a shutoff time of the IGBT. Also, the IGBT may not have equal losses during turn-on and turn-off, therefore the use of a gate driver that provides a turn-on resistance that is different from the turn-off resistance may be used.

When considering switching losses of circuit of an xEV such as an HEV, PHEV, or BEV, the power side transitions usually account for a majority of switching losses. The power side transitions include a turn-on transitions in which an IGBT transitions from an open-circuit to a conducting state between an emitter and collector of the IGBT or a turn-off transitions in which the IGBT transitions from a conducting state to an open-circuit between the emitter and collector of the IGBT. Here, a circuit is presented that reduces switching losses on the control side of a power switch via a resonant circuit that recirculates pull-down energy as pull-up energy during transitions between turn-off and turn-on. The circuit is configured to also recirculates pull-up energy as pull-down energy during transitions between turn-on and turn-off.

FIG. 1 depicts an electrified vehicle 112 that may be referred to as a plug-in hybrid-electric vehicle (PHEV). A plug-in hybrid-electric vehicle 112 may comprise one or more electric machines 114 mechanically coupled to a hybrid transmission 116. The electric machines 114 may be capable of operating as a motor or a generator. In addition, the hybrid transmission 116 is mechanically coupled to an engine 118. The hybrid transmission 116 is also mechanically coupled to a drive shaft 120 that is mechanically coupled to the wheels 122. The electric machines 114 can provide propulsion and deceleration capability when the engine 118 is turned on or off. The electric machines 114 may also act as generators and can provide fuel economy benefits by recovering energy that would normally be lost as heat in a friction braking system. The electric machines 114 may also reduce vehicle emissions by allowing the engine 118 to operate at more efficient speeds and allowing the hybrid-electric vehicle 112 to be operated in electric mode with the engine 118 off under certain conditions. An electrified vehicle 112 may also be a battery electric vehicle (BEV). In a BEV configuration, the engine 118 may not be present. In other configurations, the electrified vehicle 112 may be a full hybrid-electric vehicle (FHEV) without plug-in capability.

A traction battery or battery pack 124 stores energy that can be used by the electric machines 114. The vehicle battery pack 124 may provide a high voltage direct current (DC) output. The traction battery 124 may be electrically coupled to one or more power electronics modules 126. One or more contactors 142 may isolate the traction battery 124 from other components when opened and connect the traction battery 124 to other components when closed. The power electronics module 126 is also electrically coupled to the electric machines 114 and provides the ability to bi-directionally transfer energy between the traction battery 124 and the electric machines 114. For example, a traction battery 124 may provide a DC voltage while the electric machines 114 may operate with a three-phase alternating current (AC) to function. The power electronics module 126 may convert the DC voltage to a three-phase AC current to operate the electric machines 114. In a regenerative mode, the power electronics module 126 may convert the three-phase AC current from the electric machines 114 acting as generators to the DC voltage compatible with the traction battery 124.

The vehicle 112 may include a variable-voltage converter (VVC) 152 electrically coupled between the traction battery 124 and the power electronics module 126. The VVC 152 may be a DC/DC boost converter configured to increase or boost the voltage provided by the traction battery 124. By increasing the voltage, current requirements may be decreased leading to a reduction in wiring size for the power electronics module 126 and the electric machines 114. Further, the electric machines 114 may be operated with better efficiency and lower losses.

In addition to providing energy for propulsion, the traction battery 124 may provide energy for other vehicle electrical systems. The vehicle 112 may include a DC/DC converter module 128 that converts the high voltage DC output of the traction battery 124 to a low voltage DC supply that is compatible with low-voltage vehicle loads. An output of the DC/DC converter module 128 may be electrically coupled to an auxiliary battery 130 (e.g., 12V battery) for charging the auxiliary battery 130. The low-voltage systems may be electrically coupled to the auxiliary battery 130. One or more electrical loads 146 may be coupled to the high-voltage bus. The electrical loads 146 may have an associated controller that operates and controls the electrical loads 146 when appropriate. Examples of electrical loads 146 may be a fan, an electric heating element and/or an air-conditioning compressor.

The electrified vehicle 112 may be configured to recharge the traction battery 124 from an external power source 136. The external power source 136 may be a connection to an electrical outlet. The external power source 136 may be electrically coupled to a charger or electric vehicle supply equipment (EVSE) 138. The external power source 136 may be an electrical power distribution network or grid as provided by an electric utility company. The EVSE 138 may provide circuitry and controls to regulate and manage the transfer of energy between the power source 136 and the vehicle 112. The external power source 136 may provide DC or AC electric power to the EVSE 138. The EVSE 138 may have a charge connector 140 for plugging into a charge port 134 of the vehicle 112. The charge port 134 may be any type of port configured to transfer power from the EVSE 138 to the vehicle 112. The charge port 134 may be electrically coupled to a charger or on-board power conversion module 132. The power conversion module 132 may condition the power supplied from the EVSE 138 to provide the proper voltage and current levels to the traction battery 124. The power conversion module 132 may interface with the EVSE 138 to coordinate the delivery of power to the vehicle 112. The EVSE connector 140 may have pins that mate with corresponding recesses of the charge port 134. Alternatively, various components described as being electrically coupled or connected may transfer power using a wireless inductive coupling.

One or more wheel brakes 144 may be provided for decelerating the vehicle 112 and preventing motion of the vehicle 112. The wheel brakes 144 may be hydraulically actuated, electrically actuated, or some combination thereof. The wheel brakes 144 may be a part of a brake system 150. The brake system 150 may include other components to operate the wheel brakes 144. For simplicity, the figure depicts a single connection between the brake system 150 and one of the wheel brakes 144. A connection between the brake system 150 and the other wheel brakes 144 is implied. The brake system 150 may include a controller to monitor and coordinate the brake system 150. The brake system 150 may monitor the brake components and control the wheel brakes 144 for vehicle deceleration. The brake system 150 may respond to driver commands and may also operate autonomously to implement features such as stability control. The controller of the brake system 150 may implement a method of applying a requested brake force when requested by another controller or sub-function.

Electronic modules in the vehicle 112 may communicate via one or more vehicle networks. The vehicle network may include a plurality of channels for communication. One channel of the vehicle network may be a serial bus such as a Controller Area Network (CAN). One of the channels of the vehicle network may include an Ethernet network defined by Institute of Electrical and Electronics Engineers (IEEE) 802 family of standards. Additional channels of the vehicle network may include discrete connections between modules and may include power signals from the auxiliary battery 130. Different signals may be transferred over different channels of the vehicle network. For example, video signals may be transferred over a high-speed channel (e.g., Ethernet) while control signals may be transferred over CAN or discrete signals. The vehicle network may include any hardware and software components that aid in transferring signals and data between modules. The vehicle network is not shown in FIG. 1 but it may be implied that the vehicle network may connect to any electronic module that is present in the vehicle 112. A vehicle system controller (VSC) 148 may be present to coordinate the operation of the various components.

Figure 2:
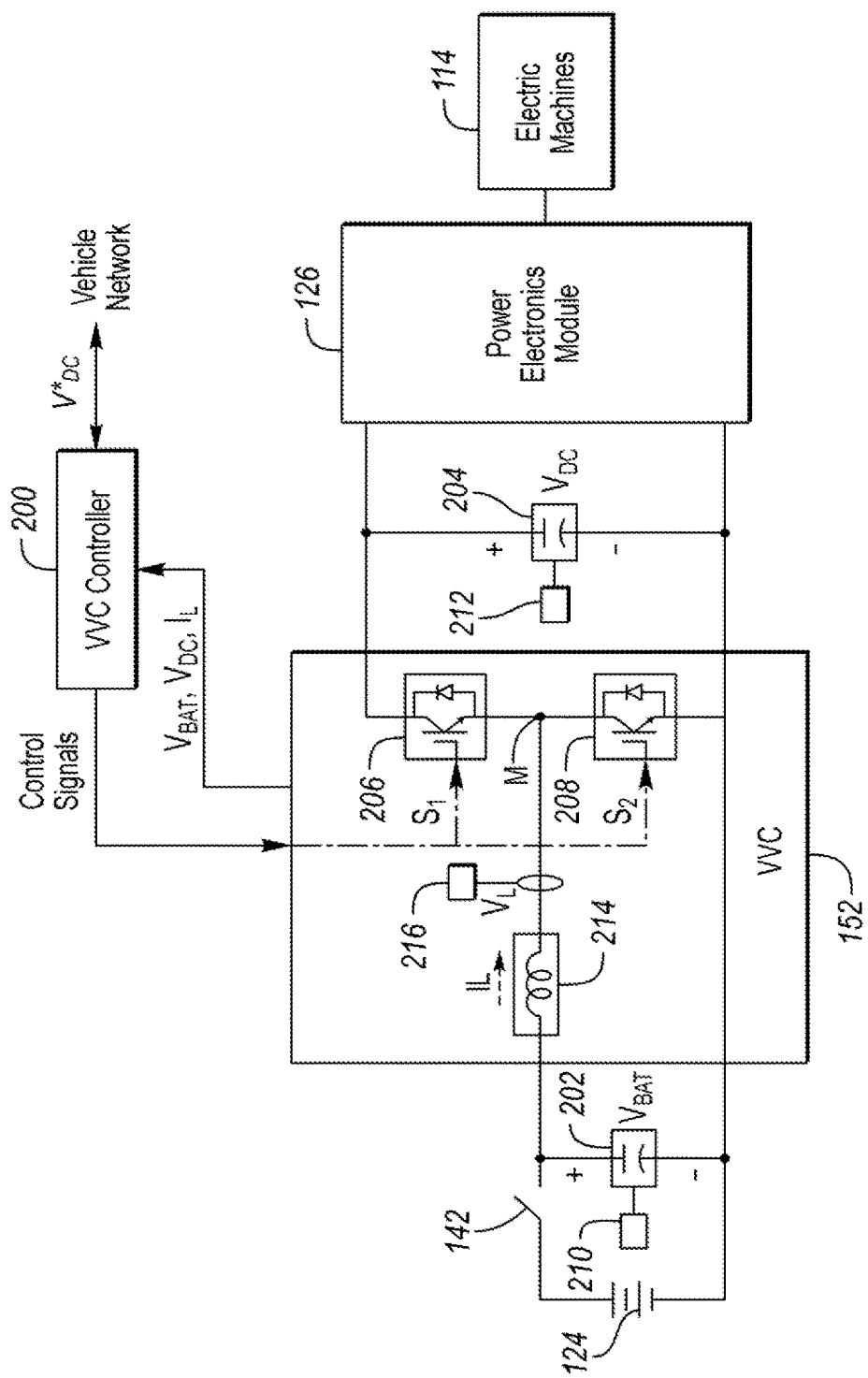
FIG. 2 is a schematic diagram of a vehicular variable voltage converter including a bypass diode.

FIG. 2 depicts a diagram of a VVC 152 that is configured as a boost converter. The VVC 152 may include input terminals that may be coupled to terminals of the traction battery 124 through the contactors 142. The VVC 152 may include output terminals coupled to terminals of the power electronics module 126. The VVC 152 may be operated to cause a voltage at the output terminals to be greater than a voltage at the input terminals. The vehicle 112 may include a VVC controller 200 that monitors and controls electrical parameters (e.g., voltage and current) at various locations within the VVC 152. In some configurations, the VVC controller 200 may be included as part of the VVC 152. The VVC controller 200 may determine an output voltage reference, $V^*_{dc}$. The VVC controller 200 may determine, based on the electrical parameters and the voltage reference, $V^*_{dc}$, a control signal sufficient to cause the VVC 152 to achieve the desired output voltage. In some configurations, the control signal may be implemented as a pulse-width modulated (PWM) signal in which a duty cycle of the PWM signal is varied. The control signal may be operated at a predetermined switching frequency. The VVC controller 200 may command the VVC 152 to provide the desired output voltage using the control signal. The particular control signal at which the VVC 152 is operated may be directly related to the amount of voltage boost to be provided by the VVC 152.

The output voltage of the VVC 152 may be controlled to achieve a desired reference voltage. In some configurations, the VVC 152 may be a boost converter. In a boost converter configuration in which the VVC controller 200 controls the duty cycle, the ideal relationship between the input voltage $V_{in}$ and the output voltage $V_{out}$ and the duty cycle D may be illustrated using the following equation:

$$V_{out} = \frac{V_{in}}{(1-D)} \quad (1)$$

The desired duty cycle, D, may be determined by measuring the input voltage (e.g., traction battery voltage) and setting the output voltage to the reference voltage. The VVC 152 may be a buck converter that reduces the voltage from input to output. In a buck configuration, a different expression relating the input and output voltage to the duty cycle may be derived. In some configurations, the VVC 152 may be a buck-boost converter that may increase or decrease the input voltage. The control strategy described herein is not limited to a particular variable voltage converter topology.

With reference to FIG. 2, the VVC 152 may boost or "step up" the voltage potential of the electrical power provided by the traction battery 124. The traction battery 124 may provide high voltage (HV) DC power. In some configurations, the traction battery 124 may provide a voltage between 150 and 400 Volts. The contactor 142 may be electrically coupled in series between the traction battery 124 and the VVC 152. When the contactor 142 is closed, the HV DC power may be transferred from the traction battery 124 to the VVC 152. An input capacitor 202 may be electrically coupled in parallel to the traction battery 124. The input capacitor 202 may stabilize the bus voltage and reduce any voltage and current ripple. The VVC 152 may receive the HV DC power and boost or "step up" the voltage potential of the input voltage according to the duty cycle.

An output capacitor 204 may be electrically coupled between the output terminals of the VVC 152. The output capacitor 204 may stabilize the bus voltage and reduce voltage and current ripple at the output of the VVC 152.

Further with reference to FIG. 2, the VVC 152 may include a first switching device 206 and a second switching device 208 for boosting an input voltage to provide the boosted output voltage. The switching devices 206, 208 may be configured to selectively flow a current to an electrical load (e.g., power electronics module 126 and electric machines 114). Each switching device 206, 208 may be individually controlled by a gate drive circuit (not shown) of the VVC controller 200 and may include any type of controllable switch (e.g., an insulated gate bipolar transistor (IGBT) or field-effect transistor (FET)). The gate drive circuit may provide electrical signals to each of the switching devices 206, 208 that are based on the control signal (e.g., duty cycle of PWM control signal). A diode may be coupled across each of the switching devices 206, 208. The switching devices 206, 208 may each have an associated switching loss. The switching losses are those power losses that occur during state changes of the switching device (e.g., on/off and off/on transitions). The switching losses may be quantified by the current flowing through and the voltage across the switching device 206, 208 during the transition. The switching devices may also have associated conduction losses that occur when the device is switched on.

The vehicle system may include sensors for measuring electrical parameters of the VVC 152. A first voltage sensor 210 may be configured to measure the input voltage, (e.g., voltage of the battery 124), and provide a corresponding input signal ($V_{bat}$) to the VVC controller 200. In one or more embodiments, the first voltage sensor 210 may measure the voltage across the input capacitor 202, which corresponds to the battery voltage. A second voltage sensor 212 may measure the output voltage of the VVC 152 and provide a corresponding input signal ($V_{dc}$) to the VVC controller 200.

In one or more embodiments, the second voltage sensor 212 may measure the voltage across the output capacitor 204, which corresponds to the DC bus voltage. The first voltage sensor 210 and the second voltage sensor 212 may include circuitry to scale the voltages to a level appropriate for the VVC controller 200. The VVC controller 200 may include circuitry to filter and digitize the signals from the first voltage sensor 210 and the second voltage sensor 212.

An input inductor 214, often referred to as a boost inductor, may be electrically coupled in series between the traction battery 124 and the switching devices 206, 208. The input inductor 214 may alternate between storing and releasing energy in the VVC 152 to enable the providing of the variable voltages and currents as VVC 152 output, and the achieving of the desired voltage boost. A current sensor 216 may measure the input current through the input inductor 214 and provide a corresponding current signal ($I_L$) to the VVC controller 200. The input current through the input inductor 214 may be a result of the voltage difference between the input and the output voltage of the VVC 152, the conducting time of the switching devices 206, 208, and the inductance L of the input inductor 214. The VVC controller 200 may include circuitry to scale, filter, and digitize the signal from the current sensor 216.

The VVC controller 200 may be programmed to control the output voltage of the VVC 152. The VVC controller 200 may receive input from the VVC 152 and other controllers via the vehicle network, and determine the control signals. The VVC controller 200 may monitor the input signals ($V_{bat}$, $V_{dc}$, $I_L$, $V^*_{dc}$) to determine the control signals. For example, the VVC controller 200 may provide control signals to the gate drive circuit that correspond to a duty cycle command. The gate drive circuit may then control each switching device 206, 208 based on the duty cycle command.

The control signals to the VVC 152 may be configured to drive the switching devices 206, 208 at a particular switching frequency. Within each cycle of the switching frequency, the switching devices 206, 208 may be operated at the specified duty cycle. The duty cycle defines the amount of time that the switching devices 206, 208 are in an on-state and an off-state. For example, a duty cycle of 100% may operate the switching devices 206, 208 in a continuous on-state with no turn off. A duty cycle of 0% may operate the switching devices 206, 208 in a continuous off-state with no turn on. A duty cycle of 50% may operate the switching devices 206, 208 in an on-state for half of the cycle and in an off-state for half of the cycle. The control signals for the two switches 206, 208 may be complementary. That is, the control signal sent to one of the switching devices (e.g., 206) may be an inverted version of the control signal sent to the other switching device (e.g., 208). The use of complementary control of the switching devices 206, 208 is desirable to avoid a shoot-through condition in which current flows directly through a high-side switching device 206 and a low-side switching device 208. The high-side switching device 206 is also called a pass device 206 and the low-side switching device 208 is also called a charging device 208.

Figure 5:
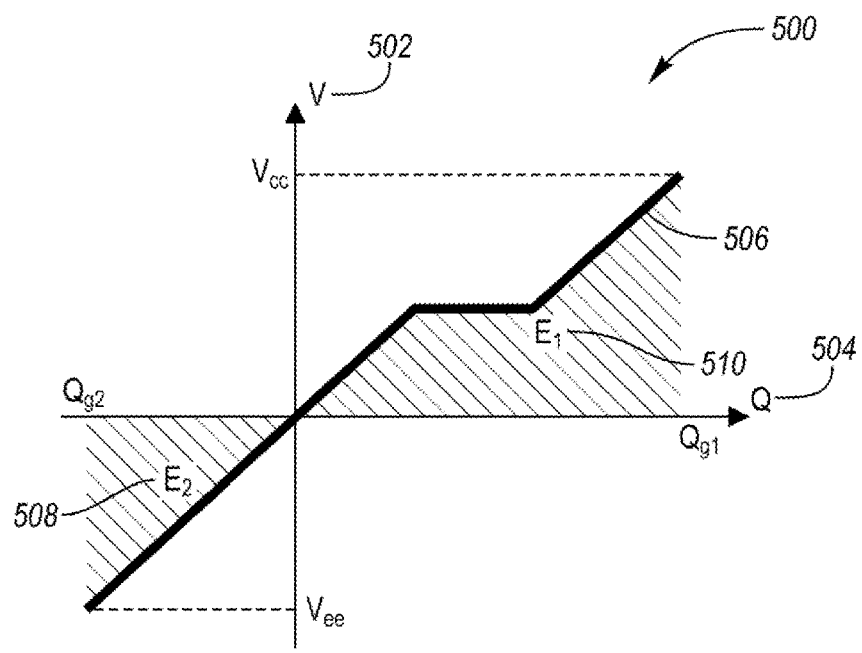
FIG. 5 is a graphical illustration of a voltage profile of a gate voltage with respect to charge during turn-on of an insulated gate bipolar junction transistor.

The current that is controlled by the switching devices 206, 208 may include a ripple component that has a magnitude that varies with a magnitude of the current, and the duty cycle and switching frequency of the switching devices 206, 208. Relative to the input current, the worst case ripple current magnitude occurs during relatively high input current conditions. When the duty cycle is fixed, an increase in the inductor current causes an increase in magnitude of the ripple current. The magnitude of the ripple current is also related to the duty cycle. The highest magnitude ripple current occurs when the duty cycle equals 50%. The general relationship between the inductor ripple current magnitude and the duty cycle may be as shown in FIG. 5. Based on these facts, it may be beneficial to implement measures to reduce the ripple current magnitude under high current and mid-range duty cycle conditions.

When designing the VVC 152, the switching frequency and the inductance value of the inductor 214 may be selected to satisfy a maximum allowable ripple current magnitude. The ripple component may be a periodic variation that appears on a DC signal. The ripple component may be defined by a ripple component magnitude and a ripple component frequency. The ripple component may have harmonics that are in an audible frequency range that may add to the noise signature of the vehicle. Further, the ripple component may cause difficulties with accurately controlling devices fed by the source. During switching transients, the switching devices 206, 208 may turn off at the maximum inductor current (DC current plus ripple current) which may cause large voltage spike across the switching devices 206, 208. Because of size and cost constraints, the inductance value may be selected based on the conducted current. In general, as current increases the inductance may decrease due to saturation.

The switching frequency may be selected to limit a magnitude of the ripple current component under worst case scenarios (e.g., highest input current and/or duty cycle close to 50% conditions). The switching frequency of the switching devices 206, 208 may be selected to be a frequency (e.g., 10 kHz) that is greater than a switching frequency of the motor/generator inverter (e.g., 5 kHz) that is coupled to an output of the VVC 152. In some applications, the switching frequency of the VVC 152 may be selected to be a predetermined fixed frequency. The predetermined fixed frequency is generally selected to satisfy noise and ripple current specifications. However, the choice of the predetermined fixed frequency may not provide best performance over all operating ranges of the VVC 152. The predetermined fixed frequency may provide best results at a particular set of operating conditions, but may be a compromise at other operating conditions.

Increasing the switching frequency may decrease the ripple current magnitude and lower voltage stress across the switching devices 206, 208, but may lead to higher switching losses. While the switching frequency may be selected for worst case ripple conditions, the VVC 152 may only operate under the worst case ripple conditions for a small percentage of the total operating time. This may lead to unnecessarily high switching losses that may lower fuel economy. In addition, the fixed switching frequency may concentrate the noise spectrum in a very narrow range. The increased noise density in this narrow range may result in noticeable noise, vibration, and harshness (NVH) issues.

The VVC controller 200 may be programmed to vary the switching frequency of the switching devices 206, 208 based on the duty cycle and the input current. The variation in switching frequency may improve fuel economy by reducing switching losses and reduce NVH issues while maintaining ripple current targets under worst case operating conditions.

During relatively high current conditions, the switching devices 206, 208 may experience increased voltage stress. At a maximum operating current of the VVC 152, it may be desired to select a relatively high switching frequency that reduces the ripple component magnitude with a reasonable level of switching losses. The switching frequency may be selected based on the input current magnitude such that as the input current magnitude increases, the switching frequency increases. The switching frequency may be increased up to a predetermined maximum switching frequency. The predetermined maximum switching frequency may be a level that provides a compromise between lower ripple component magnitudes and higher switching losses. The switching frequency may be changed in discrete steps or continuously over the operating current range.

The VVC controller 200 may be programmed to reduce the switching frequency in response to the current input being less than a predetermined maximum current. The predetermined maximum current may be a maximum operating current of the VVC 152. The change in the switching frequency may be based on the magnitude of the current input to the switching devices 206, 208. When the current is greater than the predetermined maximum current, the switching frequency may be set to a predetermined maximum switching frequency. As the current decreases, the magnitude of the ripple component decreases. By operating at lower switching frequencies as the current decreases, switching losses are reduced. The switching frequency may be varied based on the power input to the switching devices. As the input power is a function of the input current and the battery voltage, the input power and input current may be used in a similar manner.

Since the ripple current is also affected by the duty cycle, the switching frequency may be varied based on the duty cycle. The duty cycle may be determined based on a ratio of the input voltage to the output voltage. As such, the switching frequency may also be varied based on the ratio between the input voltage and the output voltage. When the duty cycle is near 50%, the predicted ripple current magnitude is a maximum value and the switching frequency may be set to the predetermined maximum frequency. The predetermined maximum frequency may be a maximum switching frequency value that is selected to minimize the ripple current magnitude. The switching frequency may be changed in discrete steps or continuously over the duty cycle range.

The VVC controller 200 may be programmed to reduce the switching frequency from the predetermined maximum frequency in response to a magnitude of a difference between the duty cycle and the duty cycle value (e.g, 50%) at which the predicted ripple component magnitude is a maximum. When the magnitude of the difference is less than a threshold, the switching frequency may be set to the predetermined frequency. When the magnitude of the difference decreases, the switching frequency may be increased toward the predetermined maximum frequency to reduce the ripple component magnitude. When the magnitude of the difference is less than a threshold, the switching frequency may be set to the predetermined maximum frequency.

The switching frequency may be limited to be between the predetermined maximum frequency and a predetermined minimum frequency. The predetermined minimum frequency may be a frequency level that is greater than a predetermined switching frequency of the power electronic module 126 that is coupled to an output of the variable voltage converter 152. The switching frequency may also be based on parasitic inductance associated with the gate of the IGBT.

Figure 3:
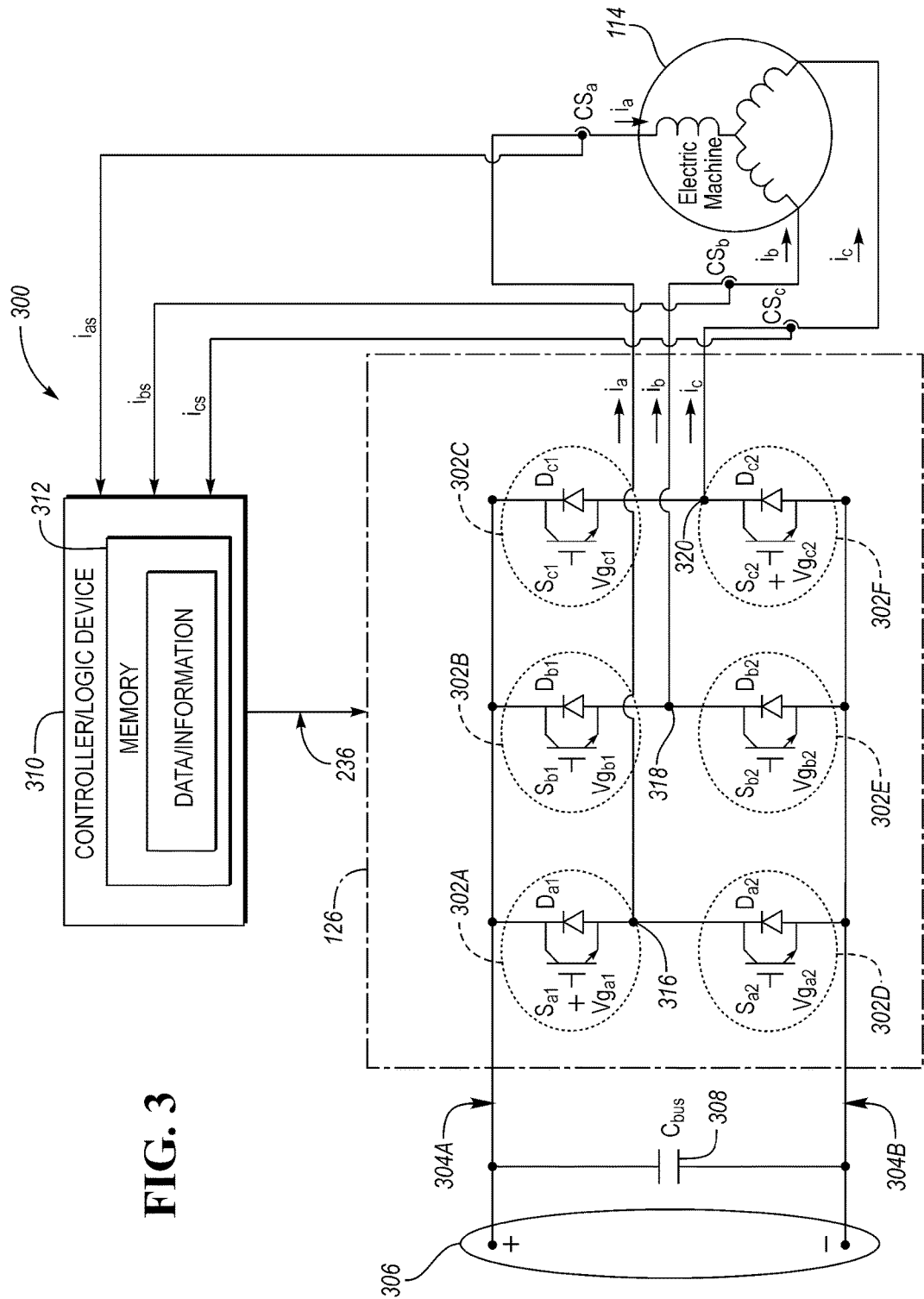
FIG. 3 is a schematic diagram of a vehicular electric machine inverter.

With reference to FIG. 3, a system 300 is provided for controlling a power electronics module (PEM) 126. The PEM 126 of FIG. 3 is shown to include a plurality of switches 302 (e.g., IGBTs) configured to collectively operate as an inverter with first, second, and third phase legs 316, 318, 320. While the inverter is shown as a three-phase converter, the inverter may include additional phase legs. For example, the inverter may be a four-phase converter, a five-phase converter, a six-phase converter, etc. In addition, the PEM 126 may include multiple converters with each inverter in the PEM 126 including three or more phase legs. For example, the system 300 may control two or more inverters in the PEM 126. The PEM 126 may further include a DC to DC converter having high power switches (e.g., IGBTs) to convert a power electronics module input voltage to a power electronics module output voltage via boost, buck or a combination thereof.

As shown in FIG. 3, the inverter may be a DC-to-AC converter. In operation, the DC-to-AC converter receives DC power from a DC power link 306 through a DC bus 304 and converts the DC power to AC power. The AC power is transmitted via the phase currents ia, ib, and is to drive an AC machine also referred to as an electric machine 114, such as a three-phase permanent-magnet synchronous motor (PMSM) as depicted in FIG. 3. In such an example, the DC power link 306 may include a DC storage battery to provide DC power to the DC bus 304. In another example, the inverter may operate as an AC-to-DC converter that converts AC power from the AC machine 114 (e.g., generator) to DC power, which the DC bus 304 can provide to the DC power link 306. Furthermore, the system 300 may control the PEM 126 in other power electronic topologies.

With continuing reference to FIG. 3, each of the phase legs 316, 318, 320 in the inverter includes power switches 302, which may be implemented by various types of controllable switches. In one embodiment, each power switch 302 may include a diode and a transistor, (e.g., an IGBT). The diodes of FIG. 3 are labeled $D_{a1}$, $D_{a2}$, $D_{b1}$, $D_{b2}$, $D_{c1}$, and $D_{c2}$ while the IGBTs of FIG. 3 are respectively labeled $S_{a1}$, $S_{a2}$, $S_{b1}$, $S_{b2}$, $S_{c1}$, and $S_{c2}$. The power switches $S_{a1}$, $S_{a2}$, $D_{a1}$, and $D_{a2}$ are part of phase leg A of the three-phase converter, which is labeled as the first phase leg A 316 in FIG. 3. Similarly, the power switches $S_{b1}$, $S_{b2}$, $D_{b1}$, and $D_{b2}$ are part of phase leg B 318 and the power switches $S_{c1}$, $S_{c2}$, $D_{c1}$, and $D_{c2}$ are part of phase leg C 320 of the three-phase converter. The inverter may include any number of the power switches 302 or circuit elements depending on the particular configuration of the inverter. The diodes ($D_{xx}$ are connected in parallel with the IGBTs ($S_{xx}$ however, as the polarities are reversed for proper operation, this configuration is often referred to as being connected anti-parallel. A diode in this anti-parallel configuration is also called a freewheeling diode.

As illustrated in FIG. 3, current sensors $CS_a$, $CS_b$, and $CS_c$ are provided to sense current flow in the respective phase legs 316, 318, 320. FIG. 3 shows the current sensors $CS_a$, $CS_b$, and $CS_c$ separate from the PEM 126. However, current sensors $CS_a$, $CS_b$, and $CS_c$ may be integrated as part of the PEM 126 depending on its configuration. Current sensors $CS_a$, $CS_b$, and $CS_c$ of FIG. 3 are installed in series with each of phase legs A, B and C (i.e., phase legs 316, 318, 320 in FIG. 3) and provide the respective feedback signals $i_{as}$, $i_{bs}$, and $i_{cs}$ (also illustrated in FIG. 3) for the system 300. The feedback signals $i_{as}$, $i_{bs}$, and $i_{as}$ may be raw current signals processed by logic device (LD) 310 or may be embedded or encoded with data or information about the current flow through the respective phase legs 316, 318, 320. Also, the power switches 302 (e.g., IGBTs) may include current sensing capability. The current sensing capability may include being configured with a current mirror output, which may provide data/signals representative of $i_{as}$, $i_{bs}$, and $i_{as}$. The data/signals may indicate a direction of current flow, a magnitude of current flow, or both the direction and magnitude of current flow through the respective phase legs A, B, and C.

Referring again to FIG. 3, the system 300 includes a logic device (LD) or controller 310. The controller or LD 310 can be implemented by various types or combinations of electronic devices and/or microprocessor-based computers or controllers. To implement a method of controlling the PEM 126, the controller 310 may execute a computer program or algorithm embedded or encoded with the method and stored in volatile and/or persistent memory 312. Alternatively, logic may be encoded in discrete logic, a microprocessor, a microcontroller, or a logic or gate array stored on one or more integrated circuit chips. As shown in the embodiment of FIG. 3, the controller 310 receives and processes the feedback signals $i_{as}$, $i_{bs}$, and $i_{cs}$ to control the phase currents $i_a$, $i_b$, and $i_c$ such that the phase currents $i_a$, $i_b$, and $i_c$ flow through the phase legs 316, 318, 320 and into the respective windings of the electric machine 114 according to various current or voltage patterns. For example, current patterns can include patterns of phase currents $i_a$, $i_b$, and $i_c$ flowing into and away from the DC-bus 304 or a DC-bus capacitor 308. The DC-bus capacitor 308 of FIG. 3 is shown separate from the PEM 126. However, the DC-bus capacitor 308 may be integrated as part of the PEM 126.

As shown in FIG. 3, a storage medium 312 (hereinafter "memory"), such as computer-readable memory may store the computer program or algorithm embedded or encoded with the method. In addition, the memory 312 may store data or information about the various operating conditions or components in the PEM 126. For example, the memory 312 may store data or information about current flow through the respective phase legs 316, 318, 320. The memory 312 can be part of the controller 310 as shown in FIG. 3. However, the memory 312 may be positioned in any suitable location accessible by the controller 310.

As illustrated in FIG. 3, the controller 310 transmits at least one control signal 236 to the power converter system 126. The power converter system 126 receives the control signal 322 to control the switching configuration of the inverter and therefore the current flow through the respective phase legs 316, 318, and 320. The switching configuration is a set of switching states of the power switches 302 in the inverter. In general, the switching configuration of the inverter determines how the inverter converts power between the DC power link 306 and the electric machine 114.

To control the switching configuration of the inverter, the inverter changes the switching state of each power switch 302 in the inverter to either an ON state or an OFF state based on the control signal 322. In the illustrated embodiment, to switch the power switch 302 to either ON or OFF states, the controller/LD 310 provides the gate voltage (Vg) to each power switch 302 and therefore drives the switching state of each power switch 302. Gate voltages $Vg_{a1}$, $Vg_{a2}$, $Vg_{b1}$, $Vg_{b2}$, $Vg_{c1}$, and $Vg_{c2}$ (shown in FIG. 3) control the switching state and characteristics of the respective power switches 302. While the inverter is shown as a voltage-driven device in FIG. 3, the inverter may be a current-driven device or controlled by other strategies that switch the power switch 302 between ON and OFF states. The controller 310 may change the gate drive for each IGBT based on the rotational speed of the electric machine 114, the mirror current, or a temperature of the IGBT switch. The change in gate drive may be selected from a plurality of gate drive currents in which the change gate drive current is proportional to a change in IGBT switching speed.

As also shown in FIG. 3, each phase leg 316, 318, and 320 includes two switches 302. However, only one switch in each of the legs 316, 318, 320 can be in the ON state without shorting the DC power link 306. Thus, in each phase leg, the switching state of the lower switch is typically opposite the switching state of the corresponding upper switch. The top switches are typically referred to as high-side switches (i.e., 302A, 302B, 302C) and the lower switches are typically referred to as low-side switches (i.e., 302D, 302E, 302F). Consequently, a HIGH state of a phase leg refers to the upper switch in the leg in the ON state with the lower switch in the OFF state. Likewise, a LOW state of the phase leg refers to the upper switch in the leg in the OFF state with the lower switch in the ON state. As a result, IGBTs with current mirror capability may be on all IGBTs, a subset of IGBTs (e.g., $S_{a1}$, $S_{b1}$, $S_{c1}$) or a single IGBT.

Two situations can occur during an active state of the three-phase converter example illustrated in FIG. 3: (1) two phase legs are in the HIGH state while the third phase leg is in the LOW state, or (2) one phase leg is in the HIGH state while the other two phase legs are in the LOW state. Thus, one phase leg in the three-phase converter, which may be defined as the "reference" phase for a specific active state of the inverter, is in a state opposite to the other two phase legs, or "non-reference" phases, that have the same state. Consequently, the non-reference phases are either both in the HIGH state or both in the LOW state during an active state of the inverter.

Figure 4:
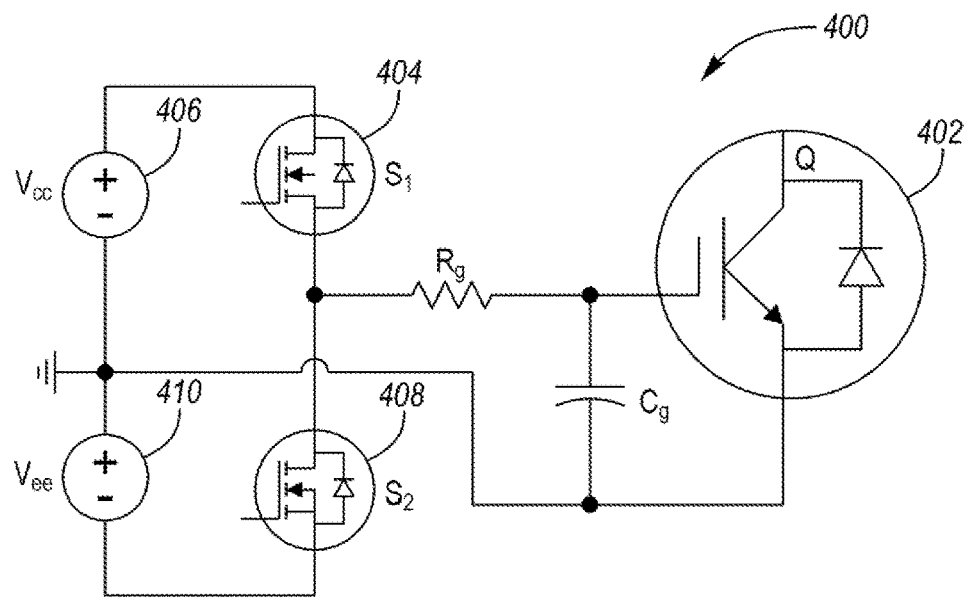
FIG. 4 is a schematic diagram of a typical insulated gate bipolar junction transistor gate drive circuit.

FIG. 4 is a schematic diagram of a typical insulated gate bipolar junction transistor gate drive circuit 400. This conventional half-bridge based gate-drive circuit may be used to control power flow to MOSFETs or IGBTs. An insulated gate bipolar junction transistor (IGBT) 402 is typically driven by a pull-up switch 404 that is supplied power via a pull-up supply 406 and a pull-down switch 408 that is supplied power via a pull-down supply 410. This gate drive circuit 400 is a popular gate-drive circuit that has been widely used for various industrial applications. An aspect of this circuit is that the gate-drive power supply needs to provide energy to charge/discharge the gate capacitor during the turn-on/turn-off process. And, the energy required to charge/discharge the gate capacitor during the turn-on/turn-off process is often dissipated in internal and external gate resistors. Here, a circuit is presented that reduces switching losses via a resonant circuit that recirculates pull-down energy as pull-up energy during transitions between turn-off and turn-on. The circuit is configured to also recirculates pull-up energy as pull-down energy during transitions between turn-on and turn-off.

FIG. 5 is a graphical illustration 500 of a voltage profile 506 of a gate voltage 502 with respect to a charge 504 during turn-on and turn-off of an insulated gate bipolar junction transistor. According to the gate-capacitor charge characteristics of MOSFET/IGBT, an equation to calculate power loss in the gate resistor $R_g$ of conventional gate-drive circuit is as follows in equation 2.

$$P_g = f_s \cdot (Q_{g1} + Q_{g2}) \cdot (V_{cc} + V_{ee}) \qquad (2)$$

In which $f_s$ is a switching frequency of the switch, $Q_{g1}$ is the gate charge from zero to Vcc 510, $Q_{g2}$ is the gate charge from −Vee to zero 508. The gate-drive circuit power loss is directly proportional to the switching frequency and independent of the gate resistance. For power device with high-switching frequencies (e.g., SiC and GaN MOSFETs) which can switch up to hundreds of kHz to MHz, it is desirable to provide a high performance gate-drive circuit with extremely low power loss to improve system efficiency.

Figure 6:
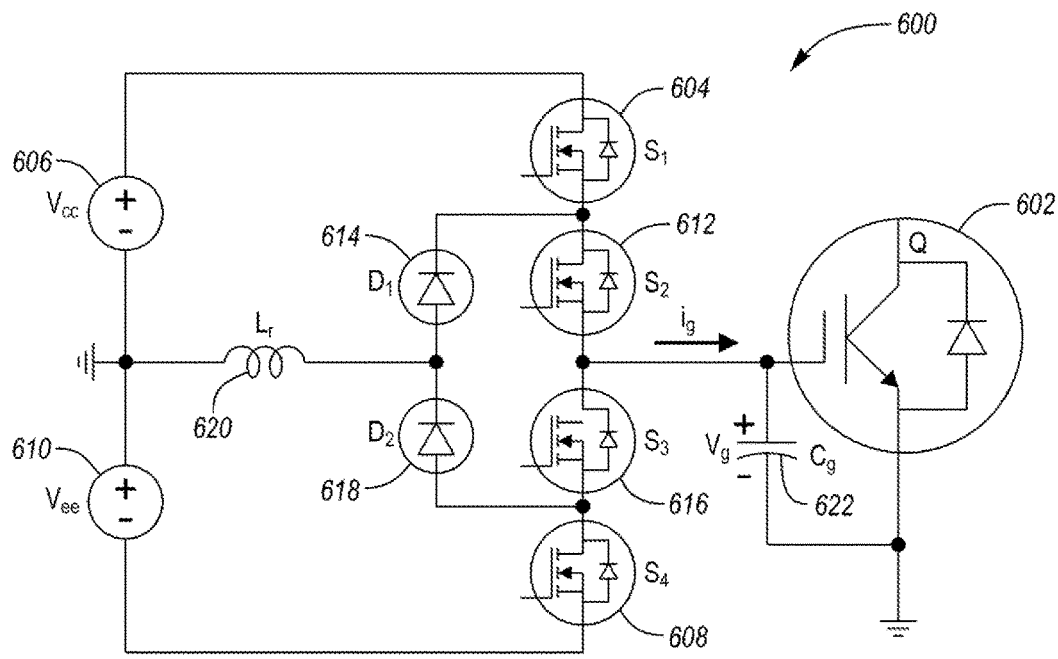
FIG. 6 is a schematic diagram of a resonant gate drive circuit for an insulated gate bipolar junction transistor.
Figure 7:
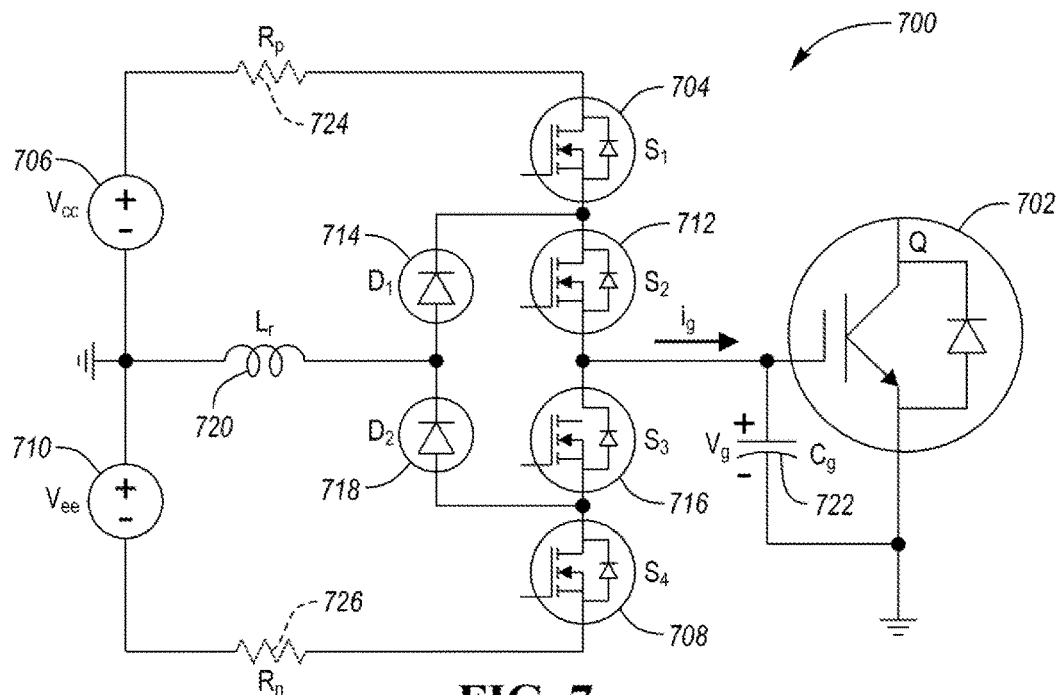
FIG. 7 is a schematic diagram of a resonant gate drive circuit for an insulated gate bipolar junction transistor including current limiting resistors.

FIG. 6 is a schematic diagram of a resonant gate drive circuit 600 for an insulated gate bipolar junction transistor (IGBT) 602. Typically, a push-pull output driver includes a pull-up switch 604 supplied by a pull-up supply 606 (e.g., Vcc) and a pull-down switch 608 supplied by a pull-down supply 610 (e.g., Vee). Here additional resonant circuit components are added to reduce switching losses by recirculating the gate charge during switching transitions. A resonant pull-up switch 612 and resonant pull-up diode 614 along with a resonant pull-down switch 616 and resonant pull-down diode 618 along with a recirculating inductor 620 form a resonant circuit with the gate capacitance 622. Similarly, FIG. 7 is a schematic diagram of a resonant gate drive circuit 700 for an insulated gate bipolar junction transistor (IGBT) 702 including current limiting resistors 724, 726. Again starting with a push-pull output driver including a pull-up switch 704 supplied by a pull-up supply 706 (e.g., Vcc) and a pull-down switch 708 supplied by a pull-down supply 710 (e.g., Vee) with additional resonant circuit components added to reduce switching losses by recirculating the gate charge during switching transitions. The additional resonant circuit components include a resonant pull-up switch 712 and resonant pull-up diode 714 along with a resonant pull-down switch 716 and resonant pull-down diode 718 along with a recirculating inductor 720 to form the resonant circuit with the gate capacitance 722.

Figure 8:
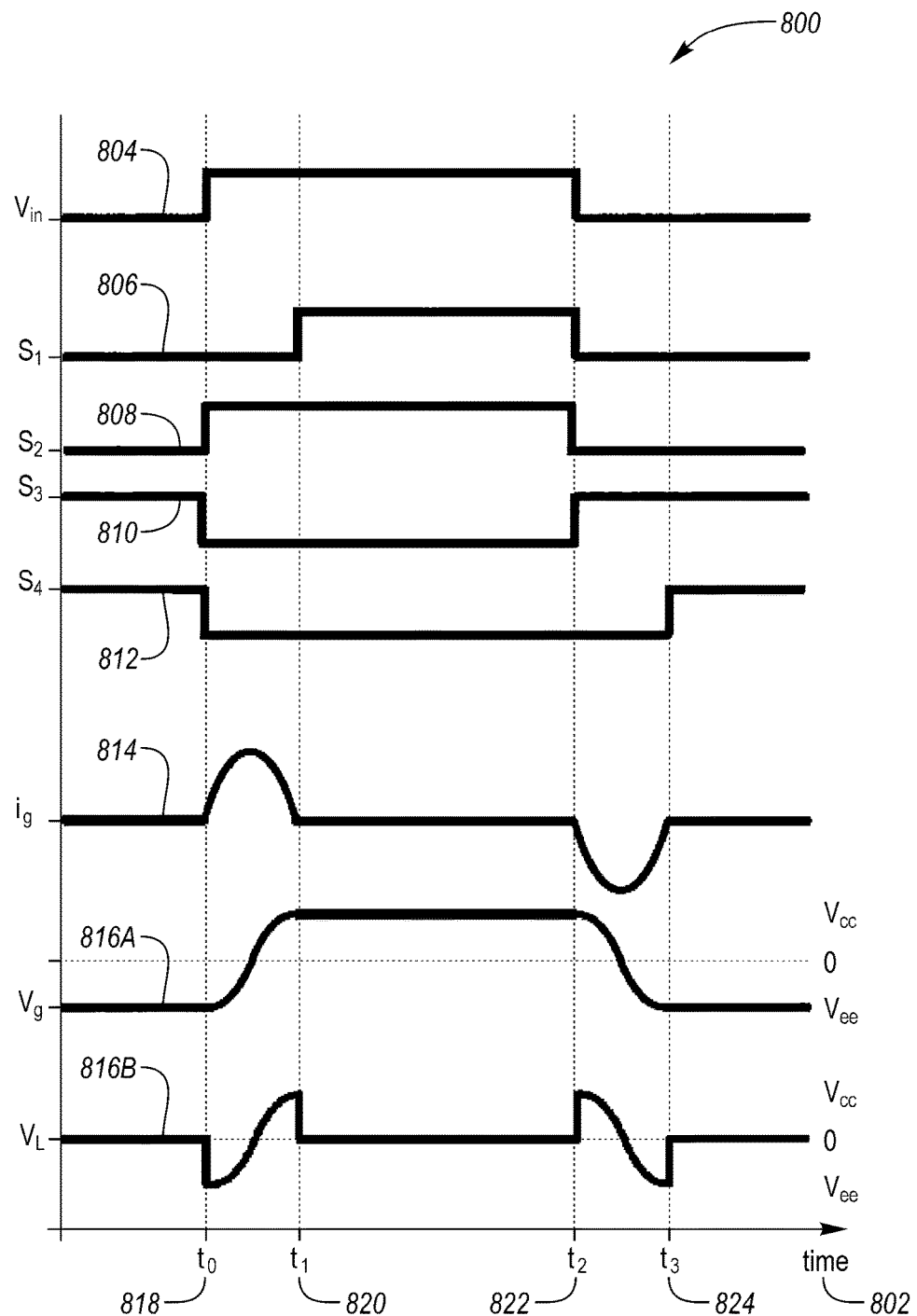
FIG. 8 is a graphical diagram of operating characteristics of a resonant gate drive circuit for a power device with respect to time.

FIG. 8 is a graphical diagram 800 of operating characteristics of a resonant gate drive circuit (e.g., the gate drive circuit of FIG. 6 or 7) for a power device with respect to time 802. Here, the operating characteristics include an input voltage profile 804, a pull-up switch gate voltage profile 806 (e.g., associated with element 604 or 704 of the gate drive circuit of FIG. 6 or 7, respectively), a resonant pull-up switch gate voltage profile 808 (e.g., associated with element 612 or 712 of the gate drive circuit of FIG. 6 or 7, respectively), a resonant pull-down switch gate voltage profile 810 (e.g., associated with element 616 or 716 of the gate drive circuit of FIG. 6 or 7, respectively), and a pull-down switch gate voltage profile 812 (e.g., associated with element 608 or 708 of the gate drive circuit of FIG. 6 or 7, respectively), along with a gate current profile 814 (e.g., associated with element 602 or 702 of the gate drive circuit of FIG. 6 or 7, respectively), a gate voltage profile 816A (e.g., associated with element 622 or 722 of the gate drive circuit of FIG. 6 or 7, respectively), and an inductor voltage profile 816B (e.g., associated with element 620 or 720 of the gate drive circuit of FIG. 6 or 7, respectively).

This graphical diagram starts at a time, prior to time t0 818, at which a resonant pull-down switch gate voltage profile 810 and a pull-down switch gate voltage profile 812 are on (e.g., high gate voltage applied) to clamp the gate voltage 816A to −Vee, such that a power device (e.g., element 602 or 702 of the gate drive circuit of FIG. 6 or 7, respectively), is off. Here, as the gate is in a steady state condition which is when no charge is flowing to or from the gate. At time t0, switches $S_3$ and $S_4$ (e.g., element 616, 618 or 716, 718 of the gate drive circuit of FIG. 6 or 7, respectively) turn off while $S_2$ (e.g., element 612 or 712 of the gate drive circuit of FIG. 6 or 7, respectively) turns on. Thus the gate capacitor $C_g$ (e.g., element 622 or 722 of the gate drive circuit of FIG. 6 or 7, respectively) is coupled in parallel with $L_r$ (e.g., element 620 or 720 of the gate drive circuit of FIG. 6 or 7, respectively) through D1 (e.g., element 614 or 714 of the gate drive circuit of FIG. 6 or 7, respectively) and $S_2$. This forms an LC resonance between $C_g$ and $L_r$. First, this resonant circuit will convert the negative charge of the gate to induce a field in the inductor by flowing a current from the gate through the inductor. When the voltage across the inductor is zero, the current from the gate and through the inductor is at a maximum. At this point in time, the inductor changes from inducing a field in the inductor to collapsing the field thereby maintaining the current flow with the inductor and creating a positive voltage potential to flow current generated from the field as it collapses to the gate thereby recirculating the energy from the negative potential to create a positive potential such that the gate voltage $V_g$ changes from −Vee to +Vee to turn on the power device Q. At time t1 820, the switch $S_1$ (e.g., element 604 or 704 of the gate drive circuit of FIG. 6 or 7, respectively) turns on. When switch $S_1$ turns on, the voltage level of the power device Q is held, locked to, or latched at the positive voltage Vcc (e.g., element 606 or 706 of the gate drive circuit of FIG. 6 or 7, respectively).

Between times t1 820~t2 822 the gate driver is in a steady state condition having the gate latched on. Specifically, at t1 820, $S_1$ turns on to latch the gate voltage to the positive supply voltage (e.g., element 606 or 706 of the gate drive circuit of FIG. 6 or 7, respectively). However, if the positive supply voltage (e.g., element 606 or 706 of the gate drive circuit of FIG. 6 or 7, respectively) is different from the negative supply voltage (e.g., element 610 or 710 of the gate drive circuit of FIG. 6 or 7, respectively), the gate voltage will be further charged/discharged to +Vcc (e.g., element 606 or 706 of the gate drive circuit of FIG. 6 or 7, respectively) if Vcc is greater than Vee. After that, the gate voltage 816A is clamped to +Vcc. Further, the inductor voltage 816B fluctuates as the current flows through the inductor. When the switch S2 is first turned on, the current flow increases quickly resulting in a negative voltage across the inductor according to V=L(di/dt). As the current flows from the gate of the power device (602 or 702) the voltage transitions from a negative potential to a positive potential, and at time t1 820, the latching switching 51 is turned on to latch the voltage at Vcc.

At time t2 822, switches $S_1$ and $S_2$ (e.g., element 604, 612 or 704, 712 of the gate drive circuit of FIG. 6 or 7, respectively) turn off while $S_3$ (e.g., element 616 or 716 of the gate drive circuit of FIG. 6 or 7, respectively) turns on. Thus the gate capacitor $C_g$ (e.g., element 622 or 722 of the gate drive circuit of FIG. 6 or 7, respectively) is then coupled in parallel with $L_r$ (e.g., element 620 or 720 of the gate drive circuit of FIG. 6 or 7, respectively) through D2 (e.g., element 618 or 718 of the gate drive circuit of FIG. 6 or 7, respectively) and $S_3$. This forms an LC resonance between $C_g$ and $L_r$. First, this resonant circuit will convert the positive charge of the gate to induce a field in the inductor by flowing a current from the gate through the inductor. When the voltage across the inductor is zero, the current from the gate and through the inductor is at a maximum. At this point in time, the inductor changes from inducing a field in the inductor to collapsing the field thereby maintaining the current flow with the inductor and creating a negative voltage potential to flow current generated from the field as it collapses to the gate thereby recirculating the energy from the positive potential to create a negative potential such that the gate voltage $V_g$ changes from +Vcc to −Vcc to turn off the power device Q if Vee is greater than Vcc. Otherwise, the anti-parallel diodes of S3 and S4 will be on to clamp the gate voltage to −Vee. At time t3 824, the switch $S_4$ (e.g., element 608 or 708 of the gate drive circuit of FIG. 6 or 7, respectively) turns on. When switch $S_4$ turns on, the voltage level of the power device Q is held, locked to, or latched at the negative voltage −Vee (e.g., element 610 or 710 of the gate drive circuit of FIG. 6 or 7, respectively).

After time t3 824 the gate driver is in a steady state condition having the gate latched on. Specifically, at t3 824, S₄ turns on to latch the gate voltage to the negative supply voltage (e.g., element 610 or 710 of the gate drive circuit of FIG. 6 or 7, respectively). However, if the negative supply voltage (e.g., element 610 or 710 of the gate drive circuit of FIG. 6 or 7, respectively) is different from the positive supply voltage (e.g., element 606 or 706 of the gate drive circuit of FIG. 6 or 7, respectively), the gate voltage will be further charged/discharged to −Vee (e.g., element 610 or 710 of the gate drive circuit of FIG. 6 or 7, respectively) if Vee is greater than Vcc. After that, the gate voltage is clamped to −Vee.

Control logic or functions performed by controller may be represented by flow charts or similar diagrams in one or more figures. These figures provide representative control strategies and/or logic that may be implemented using one or more processing strategies such as event-driven, interrupt-driven, multi-tasking, multi-threading, and the like. As such, various steps or functions illustrated may be performed in the sequence illustrated, in parallel, or in some cases omitted. Although not always explicitly illustrated, one of ordinary skill in the art will recognize that one or more of the illustrated steps or functions may be repeatedly performed depending upon the particular processing strategy being used. Similarly, the order of processing is not necessarily required to achieve the features and advantages described herein, but are provided for ease of illustration and description. The control logic may be implemented primarily in software executed by a microprocessor-based vehicle, engine, and/or powertrain controller, such as controller. Of course, the control logic may be implemented in software, hardware, or a combination of software and hardware in one or more controllers depending upon the particular application. When implemented in software, the control logic may be provided in one or more computer-readable storage devices or media having stored data representing code or instructions executed by a computer to control the vehicle or its subsystems. The computer-readable storage devices or media may include one or more of a number of known physical devices which utilize electric, magnetic, and/or optical storage to keep executable instructions and associated calibration information, operating variables, and the like.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as Read Only Memory (ROM) devices and information alterably stored on writeable storage media such as floppy disks, magnetic tapes, Compact Discs (CDs), Random Access Memory (RAM) devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A gate driver of a power device comprising:
    a negative supply configured to apply a negative potential to a gate;
    a positive supply configured to apply a positive potential to the gate;
    an inductor configured to, during turn-on,
        induce a field based on the negative potential, and
        convert the field to a current to inject a positive charge onto the gate; and
    a high-side switch configured to latch, to the positive potential, the positive charge.

2. The gate driver of claim 1 further comprising a current limiting high-side resistor configured to reduce current flow while the high-side switch latches the positive charge to the positive potential.

3. The gate driver of claim 1, wherein the negative supply has a negative supply magnitude and the positive supply has a positive supply magnitude such that the positive supply magnitude is greater than the negative supply magnitude.

4. The gate driver of claim 1, wherein the high-side switch is a metal oxide semiconductor field effect transistor (MOSFET) or a bipolar junction transistor (BJT).

5. The gate driver of claim 4, wherein the high-side switch is an N-channel MOSFET.

6. The gate driver of claim 1, wherein the inductor is further configured to, during turn-off,
    induce a turn-off field based on the positive potential, and
    convert the turn-off field to a turn-off current to inject a negative charge onto the gate.

7. The gate driver of claim 6 further comprising a low-side switch configured to latch, to the negative potential, the negative charge.

8. The gate driver of claim 7 further comprising a current limiting low-side resistor configured to reduce current flow while the low-side switch latches the negative charge to the negative potential.

9. The gate driver of claim 1, wherein the power device is a Metal Oxide Semiconductor Field Effect Transistor (MOSFET) or an Insulated Gate Bipolar Junction Transistor (IGBT).

10. A method of recirculating charge during transitioning of a power switch having an insulated gate for a vehicle powertrain comprising:

by a gate driver, during turn-on
   inducing a field in an inductor via a negative charge on a gate of the power switch;
   converting the field to a positive charge;
   flowing the positive charge onto the gate to turn on the power switch; and
   latching the positive charge onto the gate.

11. The method of claim 10, wherein the field is induced by flowing the negative charge through a resonant pull-up switch and a resonant pull-up diode, while forward biased, to the inductor.

12. The method of claim 11, wherein the positive charge is latched onto the gate by a high-side switch.

13. The method of claim 12, wherein the high-side switch and resonant pull-up switch are metal oxide semiconductor field effect transistors (MOSFETs) or bipolar junction transistors (BJTs).

14. The method of claim 10 further comprising, by a gate driver, during turn-off
   inducing a field in an inductor via a positive charge that is on the gate;
   converting the field to a negative charge;
   flowing the negative charge onto the gate to turn off the power switch; and
   latching the negative charge onto the gate.

15. The method of claim 14, wherein the field is induced by flowing the positive charge through a resonant pull-down switch and a resonant pull-down diode, while forward biased, to the inductor.

16. A gate driver of a power device comprising:
   a power supply having a positive potential and a negative potential; and
   a resonant circuit including an inductor and configured to recirculate charge during turn-off by inducing a first field based on a positive charge from a gate caused by the positive potential, and in response to reversal of a voltage across the inductor, collapsing the first field to draw charge from the gate.

17. The gate driver of claim 16, wherein the resonant circuit further includes a low-side switch configured to latch the gate to the negative potential.

18. The gate driver of claim 17 further comprising a negative potential current limiting resistor, configured to reduce current flow while the low-side switch latches the gate to the negative potential.

19. The gate driver of claim 16, wherein the resonant circuit is further configured to recirculate charge during turn-on by inducing a second field based on a negative charge from a gate caused by the negative potential, and in response to reversal of the voltage across the inductor, collapsing the second field to inject charge onto the gate.

20. The gate driver of claim 19 further comprising a high-side switch configured to latch the gate to the positive potential.

* * * * *